United States Patent
Kaneko et al.

(10) Patent No.: US 11,640,771 B2
(45) Date of Patent: May 2, 2023

(54) DISPLAY DEVICE

(71) Applicant: SHARP KABUSHIKI KAISHA, Sakai (JP)

(72) Inventors: Seiji Kaneko, Sakai (JP); Takao Saitoh, Sakai (JP); Masahiko Miwa, Sakai (JP); Yohsuke Kanzaki, Sakai (JP); Masaki Yamanaka, Sakai (JP); Yi Sun, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 305 days.

(21) Appl. No.: 17/265,363

(22) PCT Filed: Aug. 24, 2018

(86) PCT No.: PCT/JP2018/031421
§ 371 (c)(1),
(2) Date: Feb. 2, 2021

(87) PCT Pub. No.: WO2020/039591
PCT Pub. Date: Feb. 27, 2020

(65) Prior Publication Data
US 2021/0295748 A1  Sep. 23, 2021

(51) Int. Cl.
*H10K 50/844* (2023.01)
*G09F 9/30* (2006.01)
*H01L 27/32* (2006.01)
*H01L 51/00* (2006.01)
*H01L 51/52* (2006.01)

(52) U.S. Cl.
CPC .......... *G09F 9/301* (2013.01); *H01L 27/3276* (2013.01); *H01L 51/0097* (2013.01); *H01L 51/5253* (2013.01)

(58) Field of Classification Search
CPC ... G09F 9/301; G09F 9/00; G09F 9/30; H01L 27/3276; H01L 51/0097; H01L 51/5253; H01L 2227/323; H01L 2251/5338; H01L 27/3279; H01L 51/003; Y02E 10/549; Y02P 70/50
See application file for complete search history.

(56) References Cited

U.S. PATENT DOCUMENTS

2018/0120623 A1  5/2018  Shiina
2020/0066821 A1*  2/2020  Saitoh ............... H05B 33/10

FOREIGN PATENT DOCUMENTS

JP  2018-072669 A  5/2018

* cited by examiner

*Primary Examiner* — Kyoung Lee
(74) *Attorney, Agent, or Firm* — ScienBiziP, P.C.

(57) ABSTRACT

A display device is provided with a display area and a frame area on a flexible substrate. The display area includes a transistor and a light-emitting element, and the frame area surrounds the display area. The display device includes: an upper inorganic insulating film, a first upper metal layer, a first resin layer, a protective layer, a second upper metal layer, a second resin layer, and a third resin layer provided in a stated order above a semiconductor layer of a transistor. In a display area, the protective layer covering a whole upper face of the first resin layer comes into contact with an upper wire included in the second upper metal layer.

14 Claims, 11 Drawing Sheets

DISPLAY DEVICE

TECHNICAL FIELD

The disclosure relates to a display device.

BACKGROUND ART

Patent Document 1 discloses a pixel substrate including an organic insulating film on which wiring made of multilayer metal is provided.

CITATION LIST

Patent Literature

[Patent Document 1] Japanese Unexamined Patent Application Publication No. 2018-072669 published on May 10, 2018

SUMMARY

Technical Problem

A problem of the disclosure is that the surface of the organic insulating film is roughened when the wiring is etched, and the resulting particles from the organic substance contaminate the etching apparatus.

Solution to Problem

A display device according to an aspect of the disclosure is provided with a display area and a frame area on a flexible substrate. The display area includes a transistor and a light-emitting element, and the frame area surrounds the display area. The display device includes: a folding portion provided between the display area and a terminal unit formed at an end of the frame area; an upper inorganic insulating film, a first upper metal layer, a first resin layer, a protective layer, a second upper metal layer, a second resin layer, and a third resin layer provided in a stated order above a semiconductor layer of the transistor across the display area and the frame area; a slit and a filler layer included in the folding portion, the slit being formed in the upper layer inorganic insulating film, and the filler layer filling the slit; a first routed wire included in the first upper metal layer, sandwiched between the filler layer and the first resin layer, and intersecting with the slit; a second routed wire included in the second upper metal layer, sandwiched between the first resin layer and the second resin layer, and intersecting with the slit; and an upper wire included in the second upper metal layer, and formed in the display area to come into contact with the protective layer covering the first resin layer, the upper wire electrically connecting to the first routed wire or the second routed wire.

Advantageous Effects of Disclosure

An aspect of the disclosure makes it possible to prevent generation of organic particles in forming an upper wire of a display area.

DESCRIPTION OF EMBODIMENTS

In the descriptions below, the term "same layer" means that constituent features are formed in the same process (in the same film forming process). The term "lower layer (or layer below)" means that a constituent feature is formed in a previous process before a comparative layer is formed. The term "upper layer (or layer above)" means that a constituent feature is formed in a successive process after a comparative layer is formed.

Figure 1:
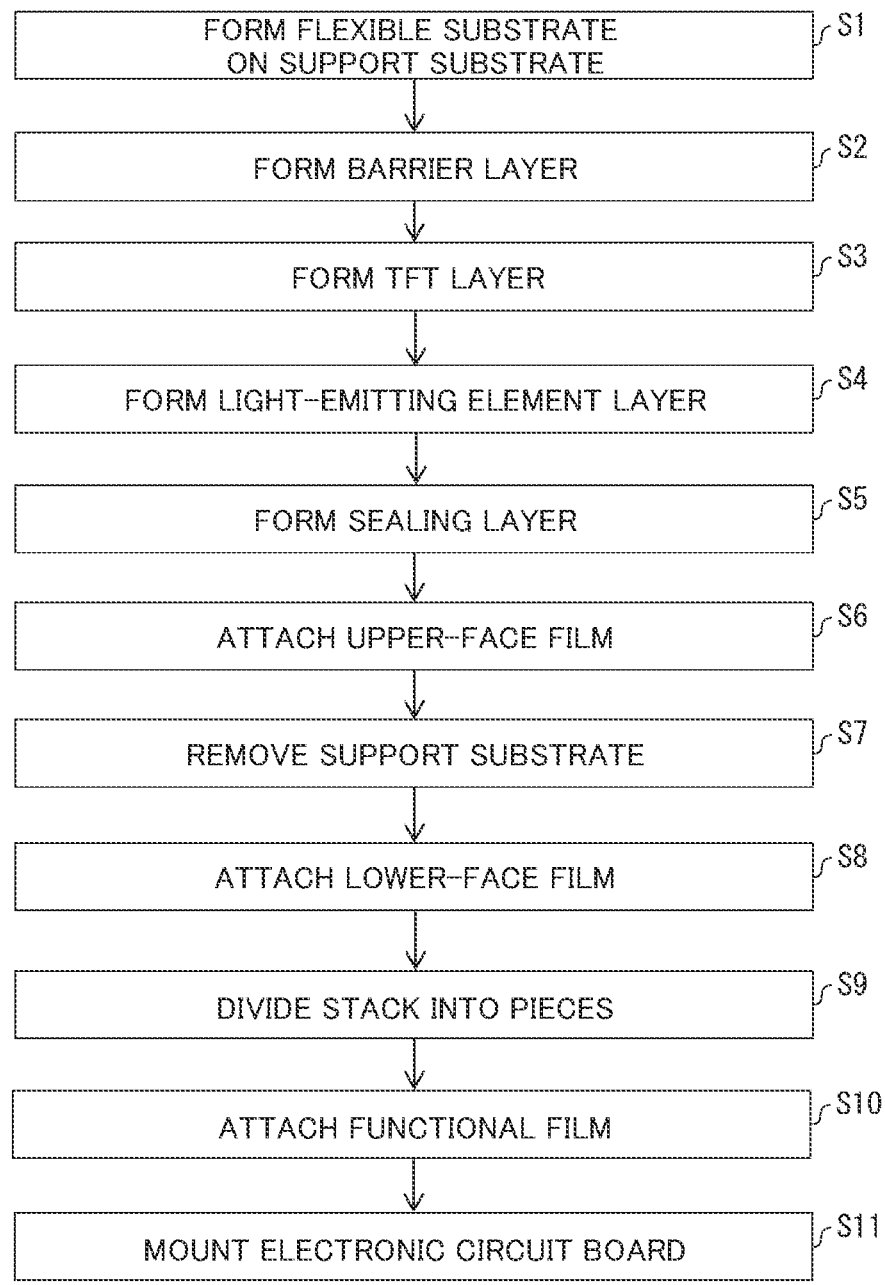
FIG. 1 is a flowchart illustrating an example of a method for producing a display device.

FIG. 1 is a flowchart illustrating an example of a method for producing a display device. FIG. 2(a) is a schematic plan view of the display device, and FIG. 2(b) is a schematic cross-section of the display device.

Figure 2:
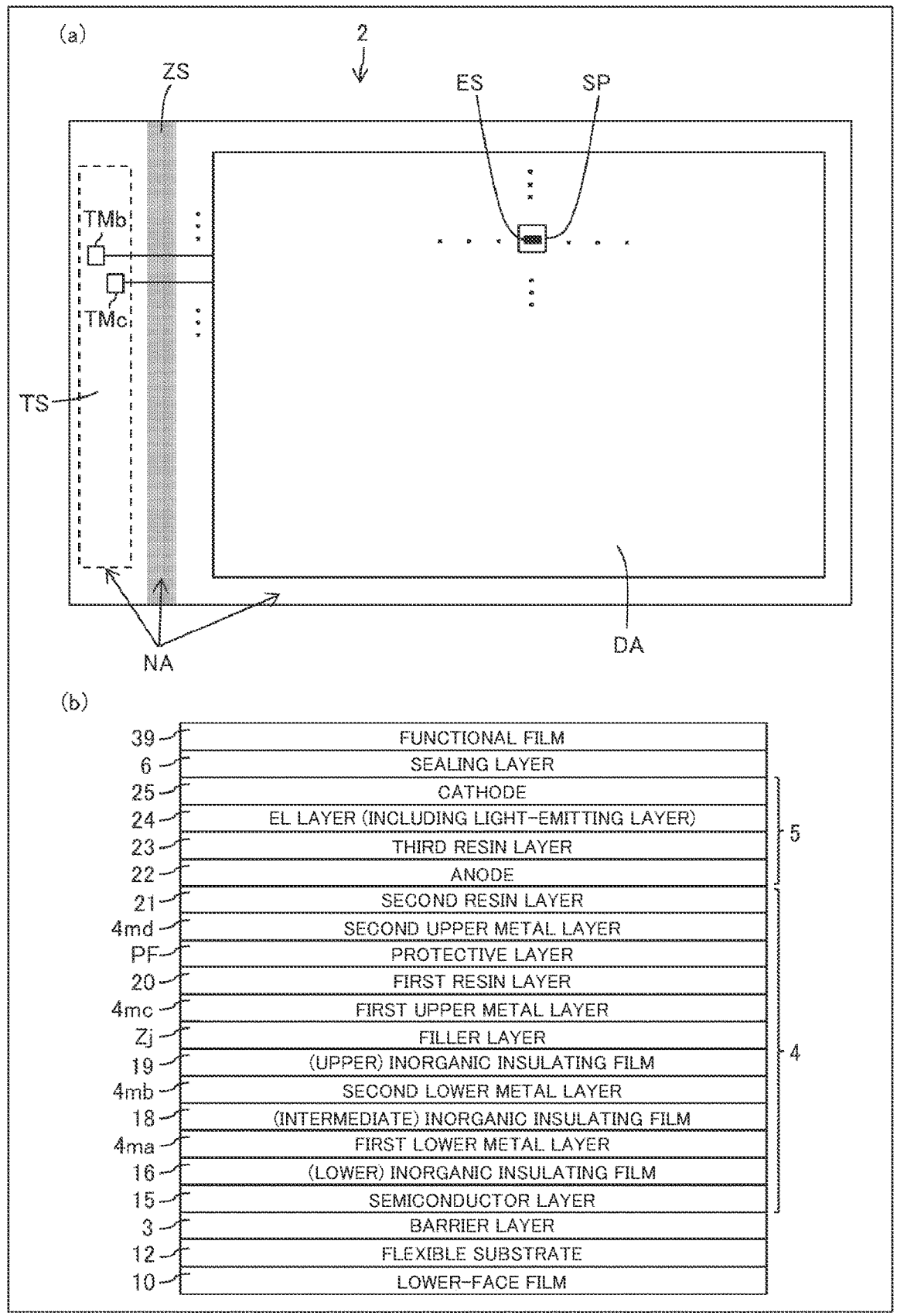
FIG. 2(a) is a schematic plan view of the display device.
FIG. 2(b) is a schematic cross-section of the display device.

In producing a flexible display device, first, as illustrated in FIGS. 1 and 2, at Step S1, a flexible substrate 12 is formed on a transparent support substrate (e.g., a mother glass). At Step S2, a barrier layer 3 is formed. At Step S3, a thin-film transistor (TFT) layer 4 is formed. At Step S4, a light-emitting element layer 5 of a top emission type is formed. Formed in the light-emitting element layer 5 of a display area DA is a light-emitting element ES of the sub-pixel SP. At Step S5, a sealing layer 6 is formed. At Step S6, on the sealing layer 6, an upper-face film is attached. At Step S7, the support substrate is removed from the flexible substrate 12 with, for example, a laser beam emitted on the support substrate. At Step S8, on a lower face of the flexible substrate 12, a lower-face film 10 is attached. At Step S9, a stack including the lower-face film 10, the flexible substrate 12, the barrier layer 3, the TFT layer 4, the light-emitting element layer 5, and the sealing layer 6 is separated into a plurality of pieces. At Step S10, to each of the obtained pieces, a functional film 39 is attached. At Step S11, an electronic circuit board (e.g., a driver chip and a flexible print substrate) is mounted on a terminal unit TS (including terminals TMb and TMc) of a frame area. Note that Steps S1 to S11 are carried out by a display device production apparatus (including a deposition apparatus carrying out each of Steps S1 to S5).

Figure 3:
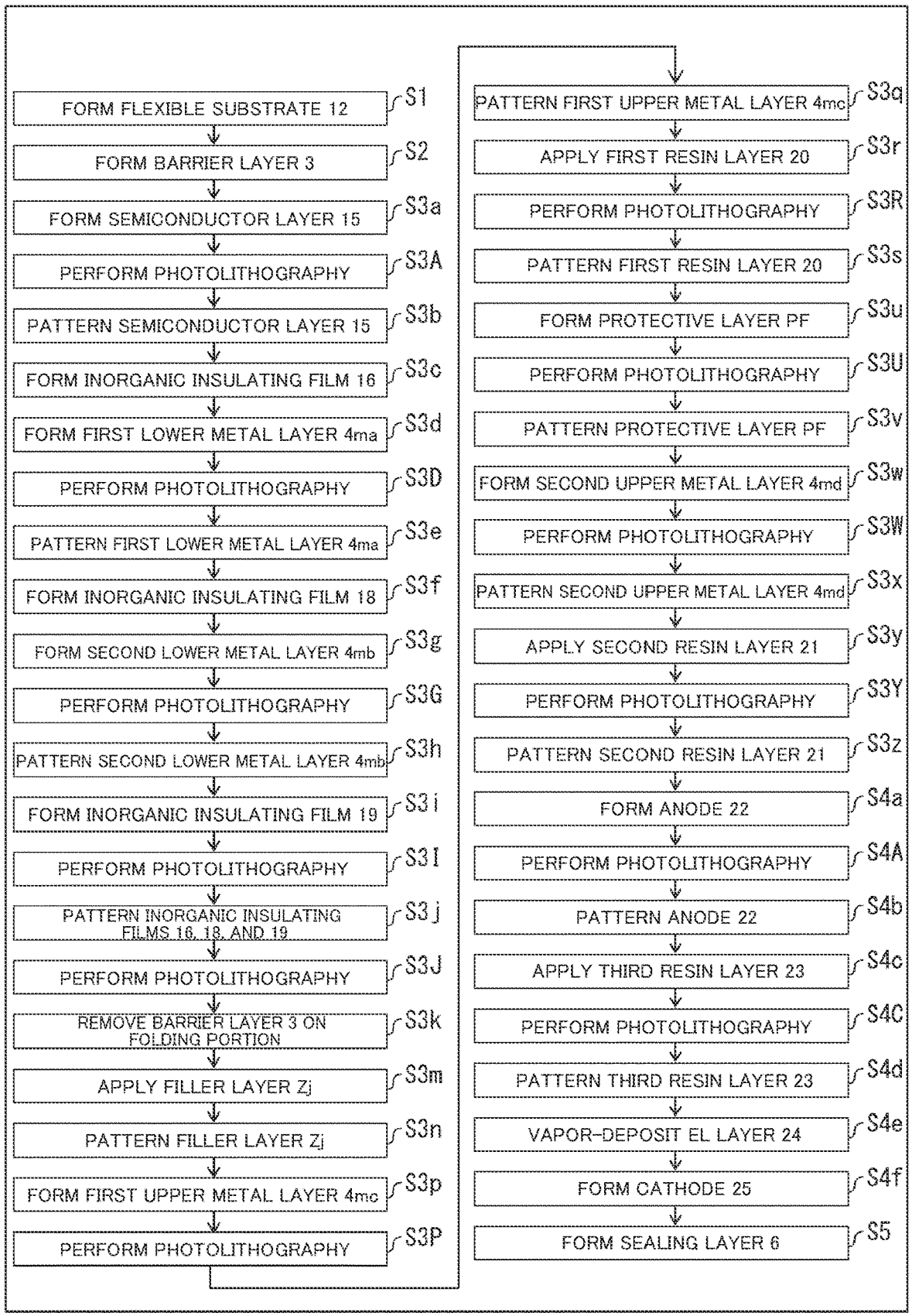
FIG. 3 is a flowchart showing in detail a part of the flowchart in FIG. 1.

FIG. 3 is a flowchart showing in detail Steps S3 and S4 in FIG. 1. As shown in FIGS. 1 to 3, after Step S2, a semiconductor layer 15 is formed at Step S3a. At Step S3A, photolithography is performed on the semiconductor layer 15. At Step S3b, the semiconductor layer 15 is patterned. At Step S3c, an inorganic insulating film 16 is formed as a lower inorganic insulating film. At Step S3d, a first lower metal layer 4ma is formed. At Step S3D, photolithography is performed on the first lower metal layer 4ma. At Step S3e, the first lower metal layer 4ma is patterned. At Step S3f, an inorganic insulating film 18 is formed as an intermediate inorganic insulating film. At Step S3g, a second lower metal layer 4mb is formed. At Step S3G, photolithography is performed on the second lower metal layer 4mb. At Step S3h, the second lower metal layer 4mb is patterned.

At Step S3i, an inorganic insulating film 19 is formed as an upper inorganic insulating film. At Step S3I, photolithography is performed on the inorganic insulating films 16, 18, and 19. At Step S3j, the inorganic insulating films 16, 18, and 19 are patterned. At Step S3J, photolithography is performed on the inorganic insulating films 16, 18, and 19. At Step S3k, the barrier layer 3 on a folding portion is removed.

At Step S3m, a filler layer Zj is applied. At Step S3n, the filler layer Zj is patterned. At Step S3p, a first upper metal layer 4mc is formed. At Step S3P, photolithography is performed on the first upper metal layer 4mc. At Step S3q, the first upper metal layer 4mc is patterned. At Step S3r, a first resin layer 20 is applied. At Step S3R, photolithography is performed on the first resin layer 20. At Step S3s, the first resin layer 20 is patterned.

At Step S3u, a protective layer PF is formed. At Step S3U, photolithography is performed on the protective layer PF. At Step S3v, the protective layer PF is patterned. At Step S3w, a second upper metal layer 4md is formed. At Step S3W, photolithography is performed on the second upper metal layer 4md. At Step S3x, the second upper metal layer 4md is patterned. At Step S3y, a second resin layer 21 is applied. At Step S3Y, photolithography is performed on the second resin layer 21. At Step S3z, the second resin layer 21 is patterned.

At Step S4a, an anode 22 is formed. At Step S4A, photolithography is performed on the anode 22. At Step S4b, the anode 22 is patterned. At Step S4c, a third resin layer 23 is applied. At Step S4C, photolithography is performed on the third resin layer 23. At Step S4d, the third resin layer 23 is patterned. At Step S4e, an electroluminescence (EL) layer 24 is vapor-deposited. At Step S4, a cathode 25 is formed. After that, at Step S5, the sealing layer 6 is formed.

The flexible substrate 12 is made of, for example, polyimide. The flexible substrate 12 can be replaced with a double-layer polyimide film, and with an inorganic insulating film sandwiched between the polyimide films.

The barrier layer (a barrier film) 3 prevents such foreign objects as water, oxygen, and mobile ions from reaching the TFT layer 4 and the light-emitting element layer 5. An example of the barrier layer 3 includes a silicon oxide film, a silicon nitride film, or a silicon oxide nitride film formed by the chemical-vapor deposition (CVD), or a multilayer film including those films.

The semiconductor film 15 can be formed of low-temperature polysilicon (LTPS) or an oxide semiconductor (e.g., an In—Ga—Zn—O-based semiconductor).

The first lower metal layer 4ma, the second lower metal layer 4mb, the first upper metal layer 4mc, and the second upper metal layer 4md are each formed of, for example, a monolayer metal film or a multilayer metal film including at least one of aluminum, tungsten, molybdenum, tantalum, chromium, titanium, or copper. In particular, the first upper metal layer 4mc and the second upper metal layer 4md can be a low-resistance metal layer formed of an aluminum film sandwiched between two titan films. Moreover, the second upper metal layer 4md can be a double layer formed of an aluminum film and a titan film above the aluminum film.

The first lower metal layer 4ma and the second lower metal layer 4mb are preferably made of the same metal material, and the first upper metal layer 4mc and the second upper metal layer 4md are preferably made of the same metal material. Thanks to such a feature, one of the neighboring routed wires can be formed in the first lower metal layer 4ma and the other routed wire can be formed in the second lower metal layer 4mb, and one of the neighboring routed wires can be formed in the first upper metal layer 4mc and the other routed wire can be formed in the second upper metal layer 4md.

The inorganic insulating films 16, 18, and 19, and the protective layer PF can be, for example, a silicon oxide (SiOx) film, or a silicon nitride (SiNx) film formed by the CVD, or a multilayer film including these films.

The filler layer Zj, the first resin layer 20, and the second resin layer 21 can be made of, for example, an applicable organic material such as polyimide or acrylic resin.

A transistor Tr includes: the semiconductor layer 15; a gate electrode included in the first lower metal layer 4ma; and a conductive electrode DE (a source electrode or a drain electrode) included in the first upper metal layer 4mc.

Figure 4:
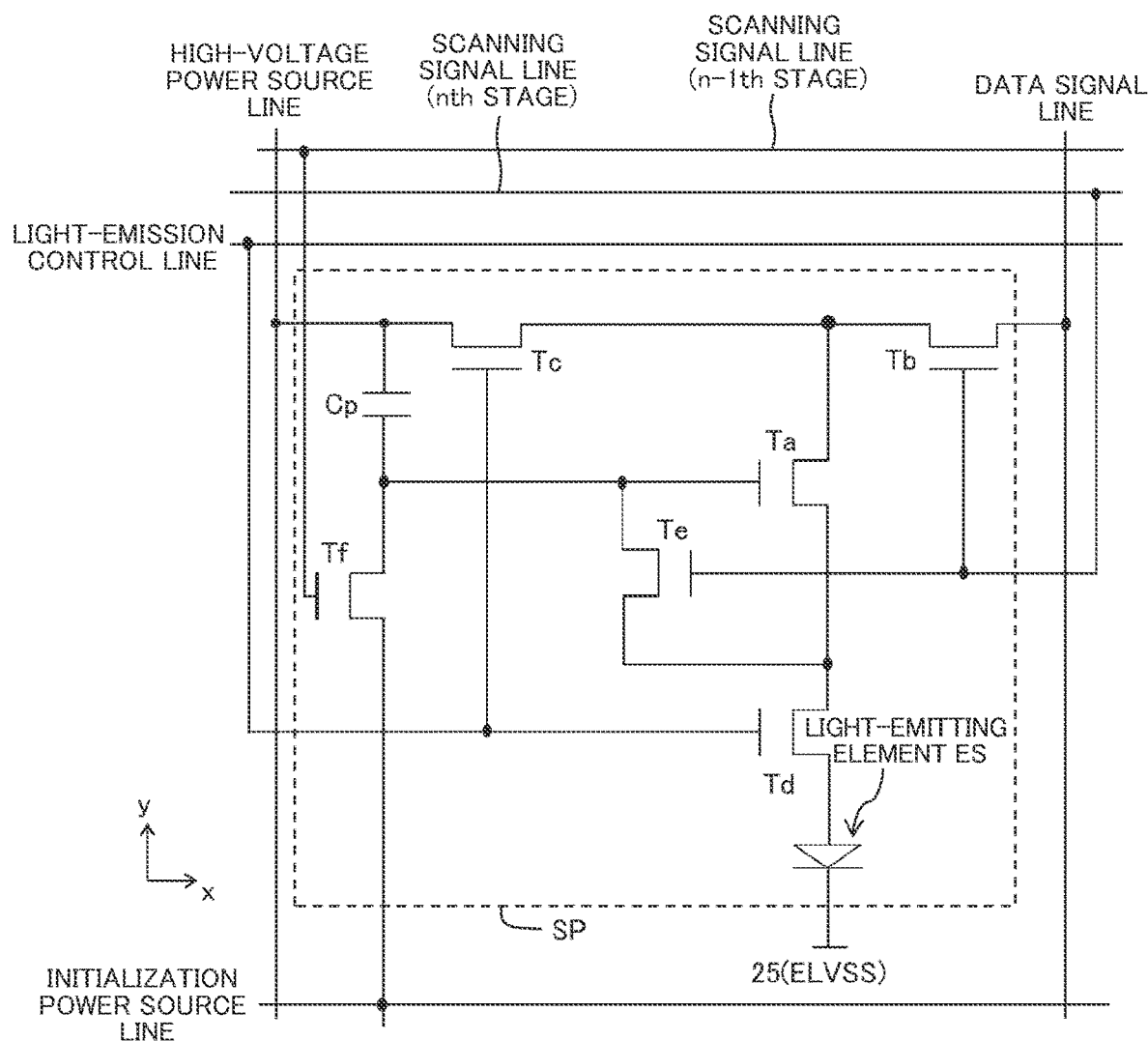
FIG. 4 is a circuit diagram illustrating a configuration of a sub-pixel.
Figure 5:
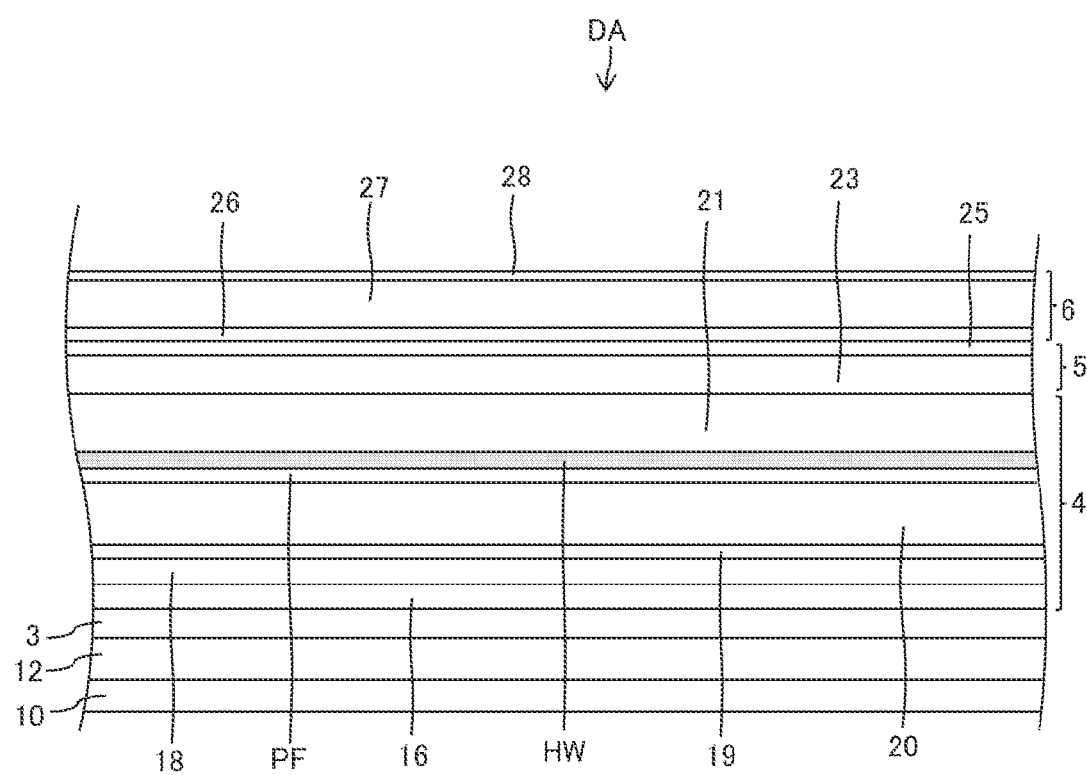
FIG. 5 is a cross-section of a display area.

The sub-pixel SP in the display area DA can be configured as illustrated in FIG. 4, for example. FIG. 5 is a cross-section of the display area DA. The display area DA is configured, for example, as follows: The first lower metal layer 4ma includes: a scanning signal line; a light-emission control line; and a gate electrode of each of p-channel transistors Ta to Tf. The second lower metal layer 4mb includes: an initialization power source line; and one of electrodes of a capacitor Cp. The first upper metal layer 4mc includes: a data signal line; and a source electrode and a drain electrode of each of the transistors. The second upper metal layer 4md includes: an upper wire HW, a relay wire RW, and a high-voltage power source line. This configuration is just an example, and shall not limit which metal layer includes which wire. Furthermore, the term "signal" recited in the disclosure includes a control signal, a power source voltage signal, and a data signal to be sent to, for example, the scanning signal line and the light-emission control line.

The light-emitting element layer 5 includes: the anode 22; the third resin layer (an edge cover) 23 covering an edge of the anode 22; the EL layer 24; and the cathode 25 above the EL layer 24. The third resin layer 23 can be made of, for example, an applicable organic material such as polyimide or acrylic resin.

In the display area DA, each sub-pixel SP is provided with a display element. The display element includes: the light-emitting element ES (e.g., an organic light-emitting diode (OLED) and a quantum dot light-emitting-diode (QLED));

and a control circuit (formed in the TFT layer 4) of the light-emitting element ES. The light-emitting element ES, formed in the light-emitting element layer 5, includes: the anode 22 and the EL layer 24 each shaped into an island; and the cathode 25.

The EL layer 24 includes a hole-injection layer, a hole-transport layer, a light-emitting layer, an electron-transport layer, and an electron-injection layer stacked on top of another in the stated order from below. Using vapor deposition or an ink-jet method, the light-emitting layer is shaped into an island and formed to overlap an opening of the third resin layer (the edge cover) 23. The other layers are shaped into islands or a monolithic form. Moreover, the EL layer 24 may omit one or more of the hole-injection layer, the hole-transport layer, the electron-transport layer, and the electron-injection layer.

In vapor-depositing to form a light-emitting layer of the OLED, a fine metal mask (FMM) is used. The FMM is a sheet (e.g., invar) including many through holes. Organic material passing through one through hole forms a light-emitting layer (corresponding to one sub-pixel SP) shaped into an island.

A light-emitting layer of the QLED is formed of, for example, a solvent in which quantum dots are dispersed. The solvent is applied by an ink-jet method to form the light-emitting layer (corresponding to one sub-pixel SP) shaped into an island.

The anode (a positive electrode) 22 includes, for example: indium tin oxide (ITO); and silver (Ag) or an alloy containing Ag stacked on top of another. The anode 22 reflects light. The cathode (a negative electrode) 25 can be formed of a translucent conductive material such as an MgAg alloy (an ultra-thin film), ITO, and indium zinc oxide (IZO).

If the light-emitting element ES is the OLED, holes and electrons recombine together in the light-emitting layer by a drive current between the anode 22 and the cathode 25, which forms an exciton. While the exciton transforms to the ground state, light is released. Since the cathode 25 is translucent and the anode 22 is light-reflective, the light emitted from the EL layer 24 travels upward. This is how the display device 2 is of a top emission type.

If the light-emitting element ES is the QLED, holes and electrons recombine together in the light-emitting layer by a drive current between the anode 22 and the cathode 25, which forms an exciton. While the exciton transforms from the conduction band level to the valence band level, light (fluorescence) is released.

In the light-emitting element layer 5, a light-emitting element (an inorganic light-emitting diode) other than the OLED and the QLED may be formed.

The sealing layer 6 is translucent, and includes: an inorganic sealing film 26 covering the cathode 25; an organic buffer film 27 above the inorganic sealing film 26; and an inorganic sealing film 28 above the organic buffer film 27. The sealing layer 6 covering the light-emitting element layer 5 prevents such foreign objects as water, oxygen, and mobile ions from penetrating into the light-emitting element layer 5.

The inorganic sealing films 26 and 28 are both inorganic insulating films. An example of the inorganic sealing films 26 and 28 includes a silicon oxide film, a silicon nitride film, or a silicon oxide nitride film formed by the CVD, or a multilayer film including those films. The organic buffer film 27, a translucent organic film providing a planarized face, may be made of an applicable organic material such as acrylic resin. The organic buffer film 27 can be formed by, for example, ink-jet application.

The lower-face film 10 is attached to the lower face of the flexible substrate 12 after the support substrate is removed, so that the display device excels in flexibility. The lower-face film 10 is made of, for example, polyethylene terephthalate (PET). The functional film 39 has at least one of such functions as optical compensation, touch sensing, and protection.

Described above is a flexible display device. In the case where an inflexible display device is produced, the barrier layer 3, the TFT layer 4, the light-emitting element layer 5, and the sealing layer 6 may be stacked on top of another on a substrate (e.g., a glass substrate). After that, the Steps S9 to S11 in FIG. 1 may be carried out.

First Embodiment

FIG. 6(a) is a plan view illustrating a configuration of the display area and the frame area according to a first embodiment. FIG. 6(b) is a cross-section taken from line b-b of FIG. 6(a). FIG. 6(c) is a cross-section taken from line c-c of FIG. 6(a).

The display device 2 illustrated in FIGS. 2 to 6 is provided with the display area DA and a frame area NA on the flexible substrate 12. The display area DA includes the transistor Tr and the light-emitting element ES. The frame area NA surrounds the display area DA. A folding portion ZS is provided between the display area DA and the terminal unit TS formed at an end of the frame area NA.

The inorganic insulating film 19 is formed across the display area DA and the frame area NA. Provided above the inorganic insulating film 19 are the first upper metal layer 4mc, the first resin layer 20, the protective layer PF, the second upper metal layer 4md, the second resin layer 21, and the third resin layer 23 in the stated order. The protective layer PF is an insulating film made of an inorganic substance (e.g., silicon nitride and silicon oxide). The first upper metal layer 4mc (including the conductive electrode DE of the transistor Tr) and the second upper metal layer 4md (including the upper wire HW) are formed of the same material. Each of the metal layers is a multilayer metal film (e.g., a three-layer structure including a titan film, an aluminum film, and a titan film stacked on top of another in the stated order).

The folding portion ZS includes a slit Sa and the filler layer Zj. The slit Sa is formed in the inorganic insulating films 16, 18, and 19, and the filler layer Zj fills the slit Sa. The first upper metal layer 4mc includes a first routed wire Wfb formed over the filler layer Zj. The second upper metal layer 4md includes a second routed wire Wsc formed over the filler layer Zj. In planar view, the first routed wire Wfb and the second routed wire Wsc are arranged side by side, and not to overlap.

In the display area DA, the EL layer 24 (including the light-emitting layer) of the light-emitting element ES is formed to correspond to the opening of the third resin layer 23. The protective layer PF covering the whole upper face of the first resin layer 20 comes into contact with the upper wire HW included in the second upper metal layer 4md.

In the folding portion ZS, the protective layer PF includes a slit SL, and the barrier layer 3 includes a slit Sb. The slit Sb is filled with the filler layer Zj. The folding portion ZS does not include any inorganic insulating film having low flexibility. Each of the first resin layer 20 and the second resin layer 21 of the frame area NA is shaped into a ridge (an elongated island) to cover the folding portion ZS. The first routed wire Wfb is sandwiched between the filler layer Zj and the first resin layer 20 both of which are highly flexible.

The second routed wire Wsc is sandwiched between the first resin layer 20 and the second resin layer 21 both of which are highly flexible.

The relay wire RW (included in the second upper metal layer 4md) of the display area DA is electrically connected to the conductive electrode DE (included in the first upper metal layer 4mc) of the transistor Tr through a contact hole penetrating the first resin layer 20 and the protective layer PF. The conductive electrode DE is a source electrode or a drain electrode.

Provided above the flexible substrate 12 are the first lower metal layer 4ma, the inorganic insulating film 18, the second lower metal layer 4mb, and the inorganic insulating film 19 in the stated order.

The frame area NA is provided with: a first display wire TWb and a first terminal wire twb both included in the first lower metal layer 4ma; and a second display wire TWc and a second terminal wire twc both included in the second lower metal layer 4mb.

Among a plurality of wires formed in the frame area NA, the first display wire TWb and the first terminal wire twb are arranged in the same layer 4ma across the folding portion from each other, and electrically connected together. The first display wire TWb and the first terminal wire twb, respectively formed closer to the display area and the terminal unit, are arranged across the folding portion from each other. Among the wires formed in the frame area NA, the second display wire TWc and the second terminal wire twc are arranged in the same layer 4mb across the folding portion from each other, and electrically connected together. The second display wire TWc and the second terminal wire twc, respectively formed closer to the display area and the terminal unit, are arranged across the folding portion from each other.

The first display wire TWb and the second display wire TWc are positioned closer to the display area DA than the folding portion ZS is. The first terminal wire twb and the second terminal wire twc are positioned closer to the terminal unit TS than the folding portion ZS is.

Figure 6:
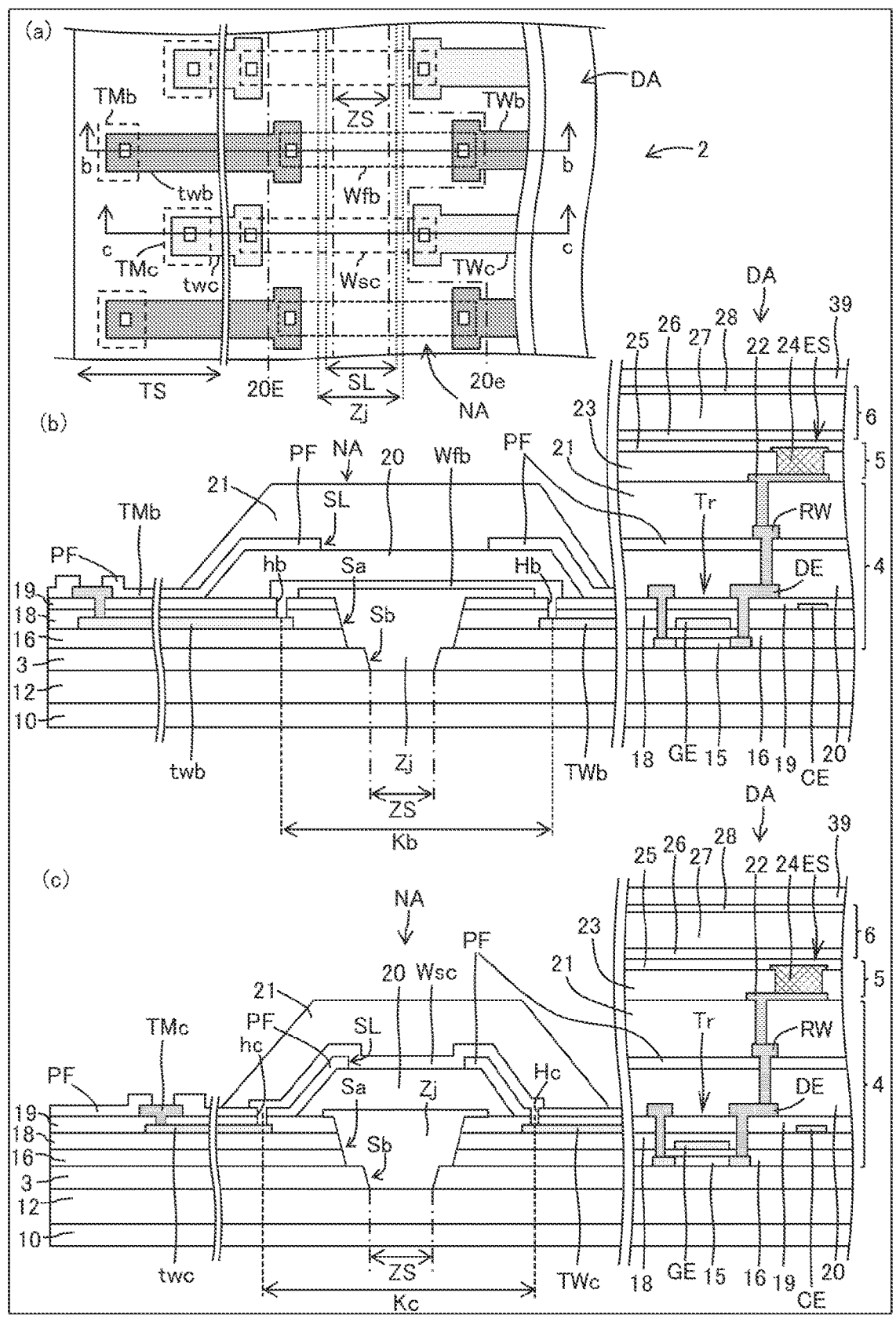
FIG. 6(a) is a plan view illustrating a configuration of the display area and a frame area according to a first embodiment.
FIG. 6(b) is a cross-section taken from line b-b of FIG. 6(a).
FIG. 6(c) is a cross-section taken from line c-c of FIG. 6(a).

As illustrated in FIG. 6, the first routed wire Wfb is connected to the first display wire TWb through a contact hole Hb formed in the inorganic insulating films 18 and 19, and to the first terminal wire twb through a contact hole hb formed in the inorganic insulating films 18 and 19. The second routed wire Wsc is connected to the second display wire TWc through a contact hole Hc formed in the inorganic insulating film 19 and the protective layer PF, and to the second terminal wire twc through a contact hole hc formed in the inorganic insulating film 19 and the protective layer PF.

The first resin layer 20 includes: an edge 20E provided toward the terminal and shaped linearly; and an edge 20e provided toward the display area and having a bend. In planar view, the contact holes Hb and hb coincide with the first resin layer 20; whereas, the contact holes Hc and hc are positioned outside, and do not coincide with, the first resin layer 20.

The first routed wire Wfb is sandwiched between the filler layer Zj and the first resin layer 20, and intersects with the slit SL of the protective layer PF. The second routed wire Wsc is sandwiched between the first resin layer 20 and the second resin layer 21, and intersects with the slit SL of the protective layer PF. As illustrated in FIG. 6, the upper wire HW is included in the second upper metal layer 4md, and formed in the display area DA to come into contact with the protective layer PF covering the first resin layer 20. The upper wire HW electrically connects to the first routed wire Wfb or the second routed wire Wsc illustrated in FIG. 6.

The terminal unit TS of the frame area NA is provided with the terminals TMb and TMc included in the first upper metal layer 4mc. The first terminal wire twb is connected to the terminal TMb through a contact hole formed in the inorganic insulating films 18 and 19. The second terminal wire twc is connected to the terminal TMc through a contact hole formed in the inorganic insulating film 19.

As illustrated in FIG. 6 the first routed wire Wfb is electrically connected to the first display wire TWb and the first terminal wire twb through the two contact holes Hb and hb. The second routed wire Wsc is electrically connected to the second display wire TWc and the second terminal wire twc through the two contact holes Hc and hc. Here, a space Kb between the two contact holes Hb and hb is equal to a space Kc between the two contact holes Hc and hc. Such spacing can provide the same wiring resistance.

Comparing (i) the contact hole Hb for electrically connecting the first routed wire Wfb to the first display wire TWb with (ii) the contact hole Hc for electrically connecting the second routed wire Wsc to the second display wire TWc, the contact hole Hb is positioned closer to the display area DA than the contact hole Hc is. Comparing (i) the contact hole hb for electrically connecting the first routed wire Wfb to the first terminal wire twb with (ii) the contact hole hc for electrically connecting the second routed wire Wsc to the second terminal wire twc, the contact hole hb is positioned closer to the display area DA than the contact hole hc is. The first routed wire Wfb is equal in length to the second routed wire Wsc.

The first upper metal layer 4mc includes the terminals TMb and TMc. The terminals TMb and TMc are in contact with the protective layer PF provided with openings exposing upper faces of the terminals TMb and TMc. The protective layer PF is in contact with, and covers, edges of the terminals TMb and TMc.

In the display area DA of the first embodiment, the protective layer PF covers the whole upper face of the first resin layer 20. Provided on the protective layer PF; namely, an inorganic insulating film, is the second upper metal layer 4md including the upper layer wire HW and the relay wire RW. The protective layer PF can keep the first resin layer 20 from being damaged (roughened) when the upper wire HW and the relay wire RW are patterned (in particular, dry-etched). Such a feature prevents generation of organic particles and keeps the etching apparatus from contamination.

Moreover, the first resin layer 20 between the first upper metal layer 4mc and the second upper metal layer 4md can eliminate unevenness due to an electrode and a wire included in the first upper metal layer 4mc, and reduce a parasitic capacitance between the metal layers. Such a feature makes it possible to reduce resistances of wires included in the first upper metal layer 4mc and the second upper metal layer 4md, which is suitable to, for example, a display device including a monolithically-formed driver circuit.

Furthermore, the first routed wire Wfb and the second routed wire Wsc, formed of the same material, are the same in length and width. As a result, the wires have the same resistance.

In addition, the edges of the terminals TMb and TMc are covered with the protective layer PF; namely, an inorganic insulating film. Hence, compared with a case where the edges of the terminals TMb and TMc are covered with a thick organic insulating film, an electronic circuit board (i.e., an IC chip) is easily mounted.

Second Embodiment

Figure 7:
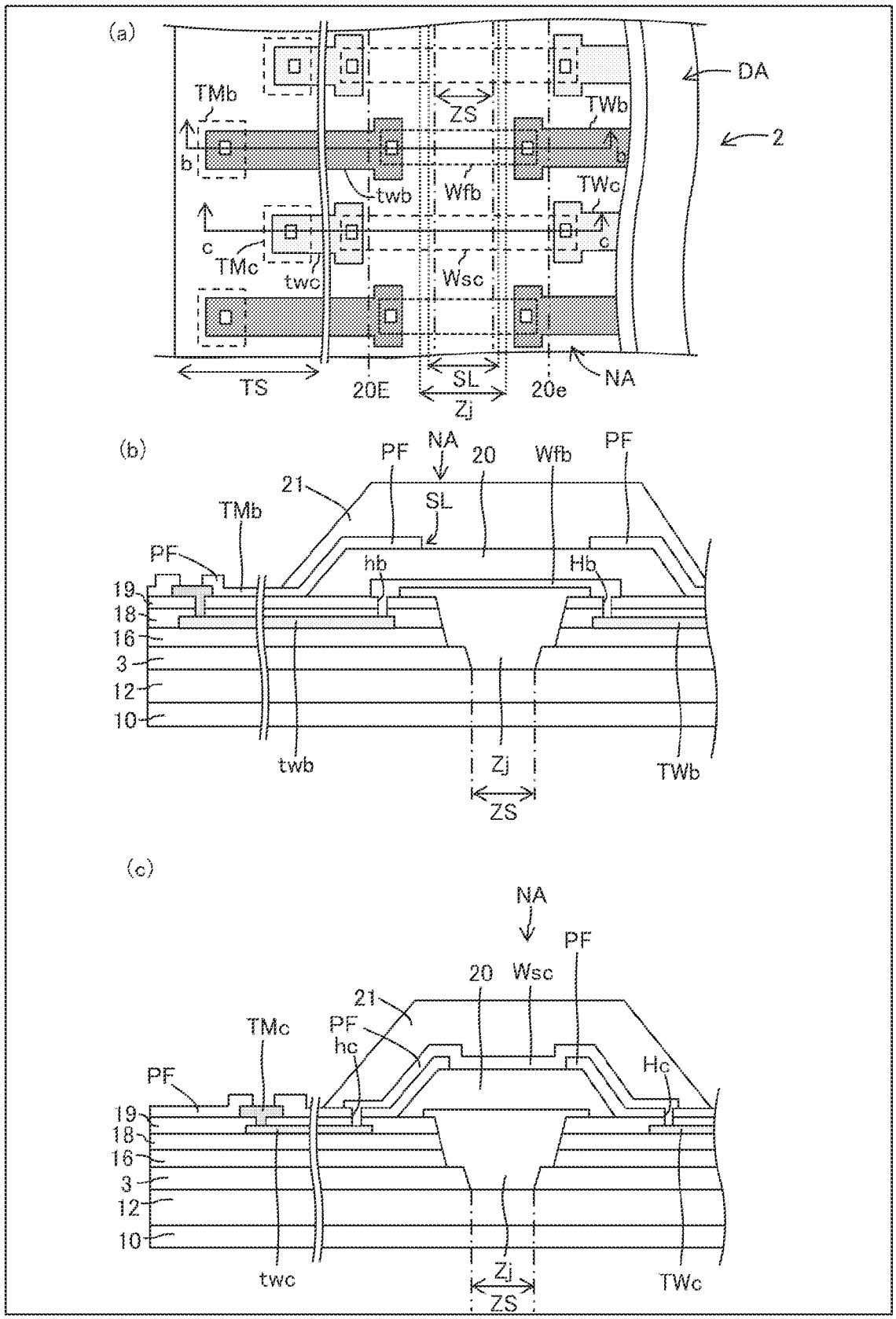
FIG. 7(a) is a plan view illustrating a configuration of a display area and a frame area according to a second embodiment.
FIG. 7(b) is a cross-section taken from line b-b of FIG. 7(a).
FIG. 7(c) is a cross-section taken from line c-c of FIG. 7(a).

FIG. 7(a) is a plan view illustrating a configuration of a display area and a frame area according to a second embodiment. FIG. 7(b) is a cross-section taken from line b-b of FIG. 7(a). FIG. 7(c) is a cross-section taken from line c-c of FIG. 7(a). In FIG. 6, the contact hole Hc is positioned closer to the folding portion ZS than the contact hole Hb is, and the contact hole hb is positioned closer to the folding portion ZS than the contact hole hc is. However, the positioning of the contact holes shall not be limited as such. As illustrated in FIG. 7, the contact hole Hb may be positioned closer to the folding portion ZS than the contact hole Hc is, and the contact hole hb may be positioned closer to the folding portion ZS than the contact hole hc is.

Third Embodiment

FIG. 8(a) is a plan view illustrating a configuration of a display area and a frame area according to a third embodiment. FIG. 8(b) is a cross-section taken from line b-b of FIG. 8(a). FIG. 8(c) is a cross-section taken from line c-c of FIG. 8(a).

Figure 8:
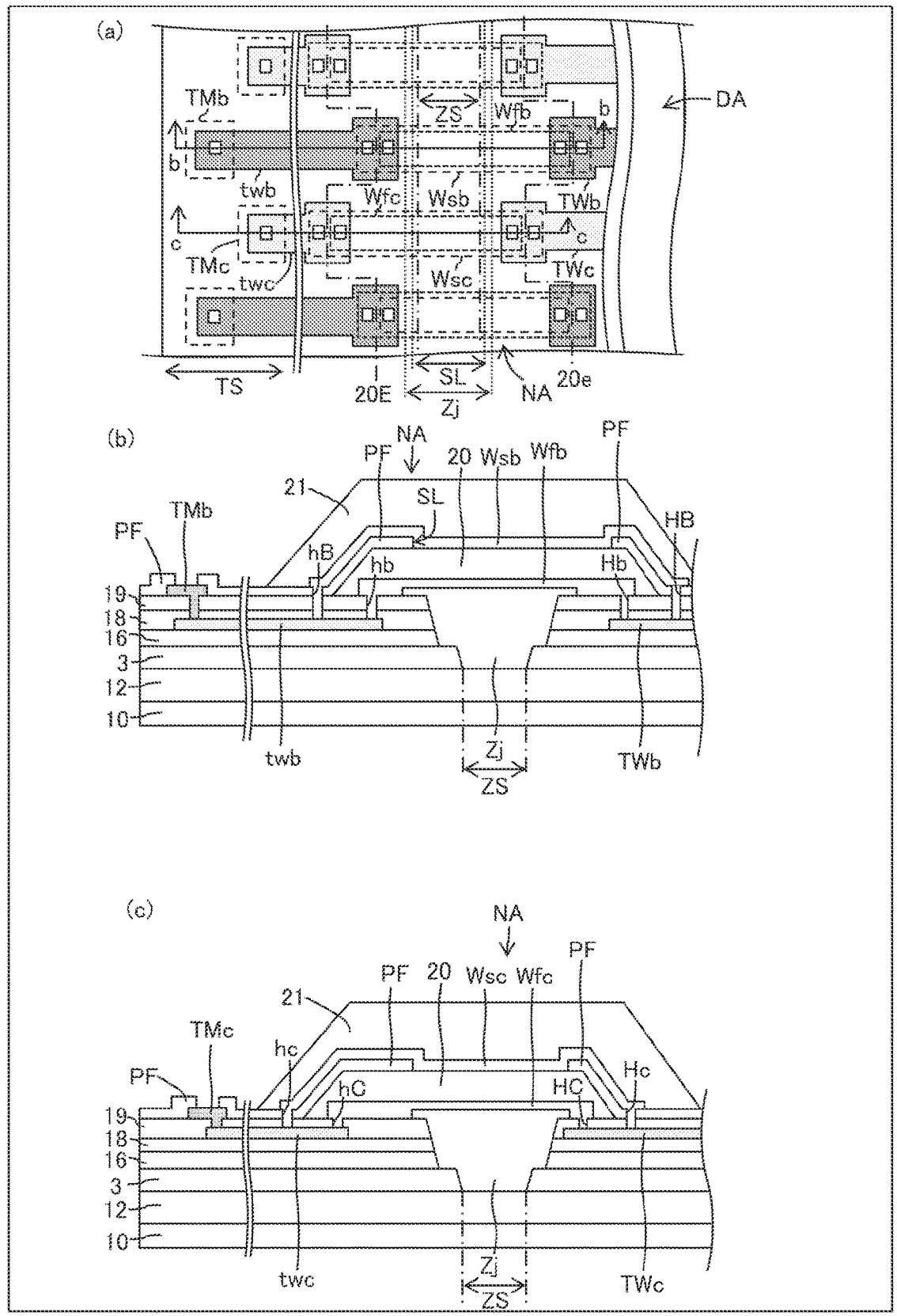
FIG. 8(a) is a plan view illustrating a configuration of a display area and a frame area according to a third embodiment.
FIG. 8(b) is a cross-section taken from line b-b of FIG. 8(a).
FIG. 8(c) is a cross-section taken from line c-c of FIG. 8(a).

In FIGS. 8 (a) and (b), the first routed wire Wfb included in the first upper metal layer 4mc is formed over the filler layer Zj, and a second routed wire Wsb included in the second upper metal layer 4md is formed over the filler layer Zj. In planar view, the first routed wire Wfb and the second routed wire Wsb overlap, and are electrically connected to each other.

Here, the first routed wire Wfb is connected to the first display wire TWb through the contact hole Hb formed in the inorganic insulating films 18 and 19, and to the first terminal wire twb through the contact hole hb formed in the inorganic insulating films 18 and 19. The second routed wire Wsb is connected to the first display wire TWb through a contact hole HB formed in the inorganic insulating films 18 and 19 and the protective layer PF, and to the first terminal wire twb through a contact hole hB formed in the inorganic insulating films 18 and 19 and the protective layer PF.

The first resin layer 20 of the frame area NA is shaped into a ridge to cover the folding portion ZS. However, in planar view, the contact holes HB and hB are positioned outside, and do not coincide with, the first resin layer 20. In planar view, the contact holes Hb and hb coincide with the first resin layer 20.

In FIGS. 8 (a) and (c), a first routed wire Wfc included in the first upper metal layer 4mc is formed over the filler layer Zj, and the second routed wire Wsc included in the second upper metal layer 4md is formed over the filler layer Zj. In planar view, the first routed wire Wfc and the second routed wire Wsc overlap, and electrically connect to each other.

Here, the first routed wire Wfc is connected to the second display wire TWc through a contact hole HC formed in the inorganic insulating film 19, and to the second terminal wire twc through a contact hole hC formed in the inorganic insulating film 19. The second routed wire Wsc is connected to the second display wire TWc through the contact hole Hc formed in the inorganic insulating film 19 and the protective layer PF, and to the second terminal wire twc through the contact hole hc formed in the inorganic insulating film 19 and the protective layer PF.

The first resin layer 20 of the frame area NA is shaped into a ridge to cover the folding portion ZS. However, in planar view, the contact holes Hc and hc are positioned outside, and do not coincide with, the first resin layer 20. In planar view, the contact holes HC and hC coincide with the first resin layer 20.

In the third embodiment, the first display wire TWb and the first terminal wire twb are connected together through the first routed wire Wfb and the second routed wire Wsb in a stacked (redundant) structure, and the second display wire TWc and the second terminal wire twc are connected together through the first routed wire Wfc and the second routed wire Wsc in a stacked (redundant) structure. The structures reduce the risk of a broken wire and lowers a resistance. Such a feature is suitable to, for example, transmission of a power source voltage and a data signal (a grayscale signal).

Fourth Embodiment

Figure 9:
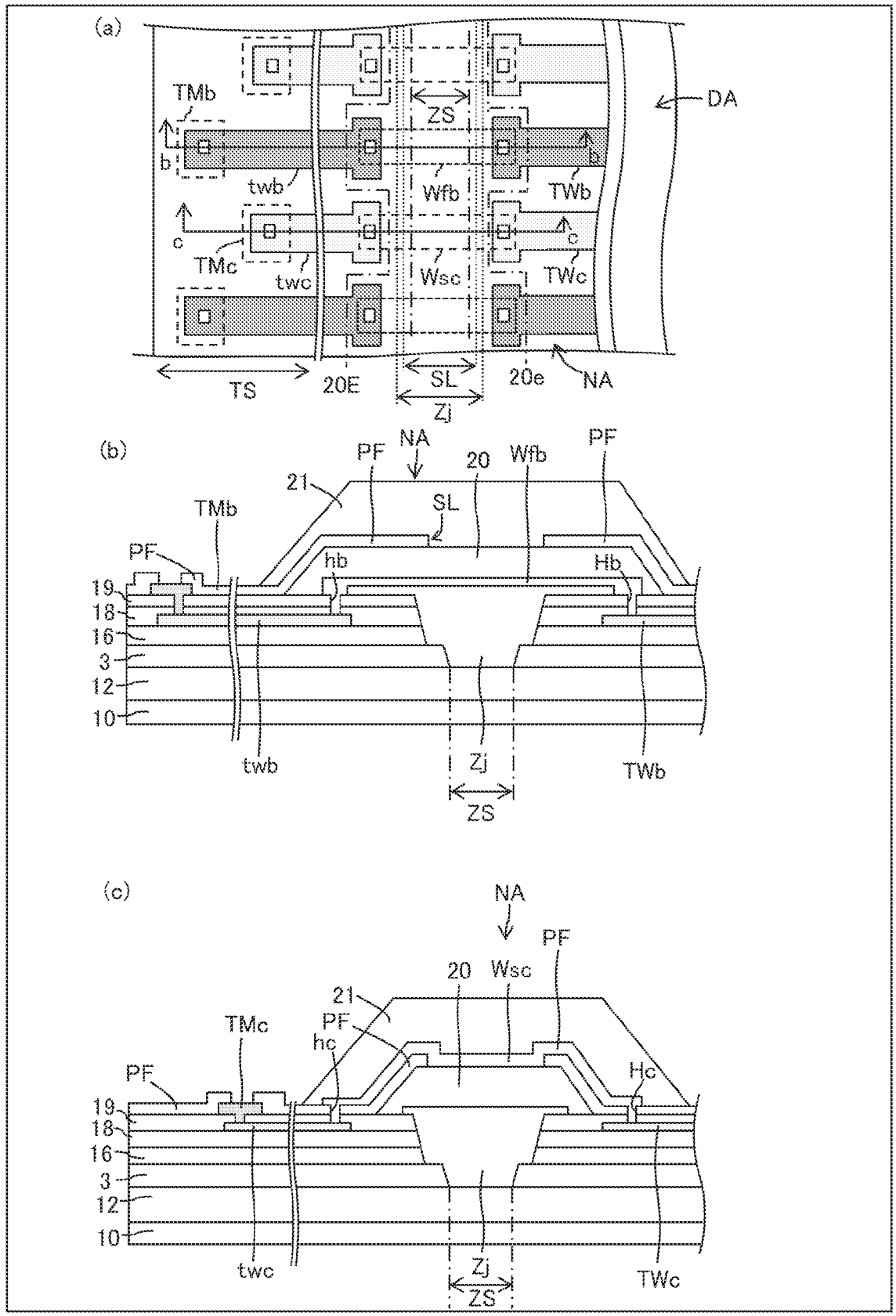
FIG. 9(a) is a plan view illustrating a configuration of a display area and a frame area according to a fourth embodiment.
FIG. 9(b) is a cross-section taken from line b-b of FIG. 9(a).
FIG. 9(c) is a cross-section taken from line c-c of FIG. 9(a).

FIG. 9(a) is a plan view illustrating a configuration of a display area and a frame area according to a fourth embodiment. FIG. 9(b) is a cross-section taken from line b-b of FIG. 9(a). FIG. 9(c) is a cross-section taken from line c-c of FIG. 9(a). In FIG. 9, the contact hole Hb for electrically connecting the first routed wire Wfb and the first display wire TWb together and the contact hole Hc for electrically connecting the second routed wire Wsc and the second display wire TWc together are spaced apart from the display area DA at an equal distance. The contact hole hb for electrically connecting the first routed wire Wfb and the first terminal wire twb together and the contact hole hc for electrically connecting the second routed wire Wsc and the second terminal wire twc together are spaced apart from the display area DA at an equal distance. Hence, the first routed wire Wfb and the second routed wire Wsc are equal in length.

Fifth Embodiment

Figure 10:
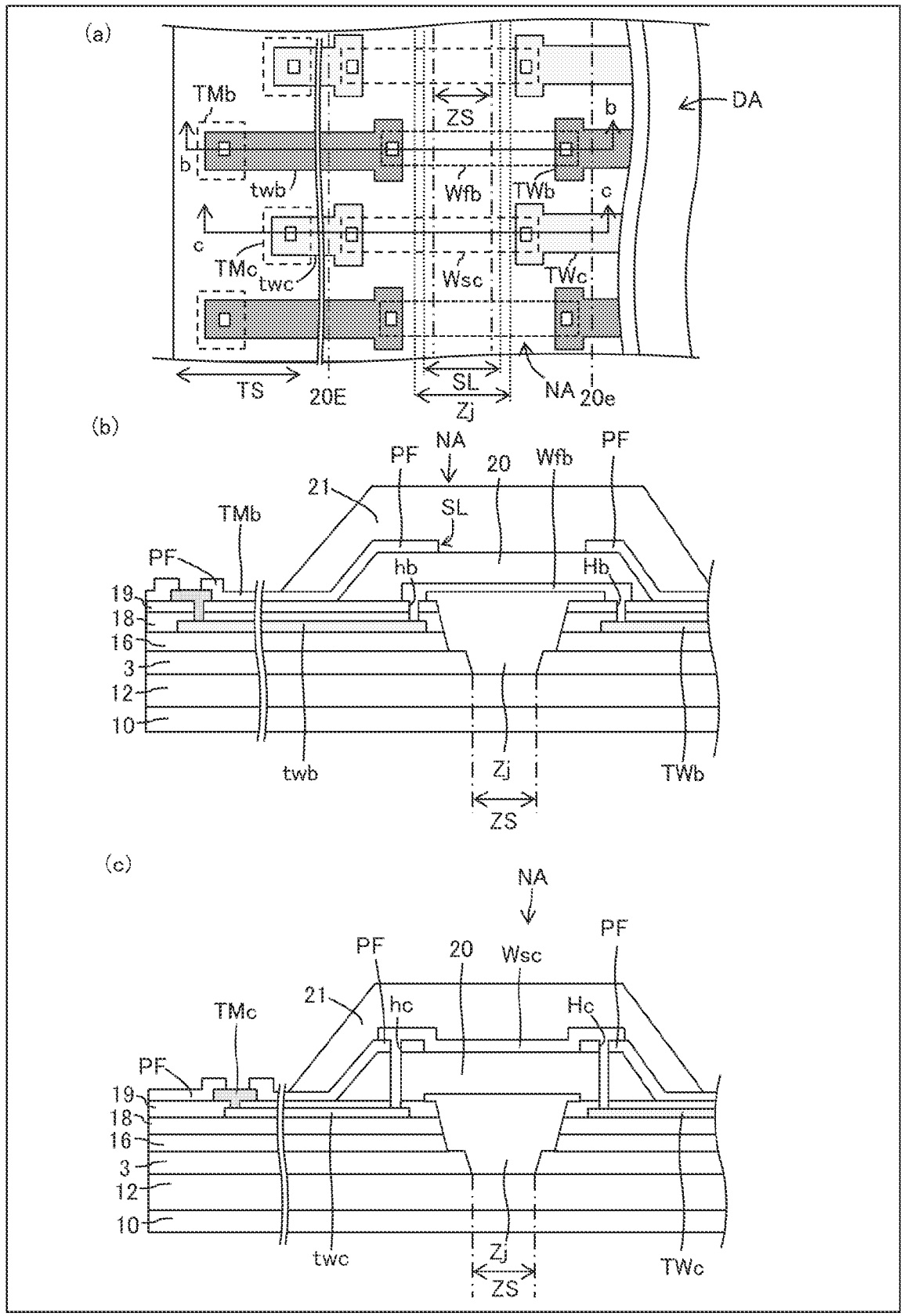
FIG. 10(a) is a plan view illustrating a configuration of a display area and a frame area according to a fifth embodiment.
FIG. 10(b) is a cross-section taken from line b-b of FIG. 10(a).
FIG. 10(c) is a cross-section taken from line c-c of FIG. 10(a).

FIG. 10(a) is a plan view illustrating a configuration of a display area and a frame area according to a fifth embodiment. FIG. 10(b) is a cross-section taken from line b-b of FIG. 10(a). FIG. 10(c) is a cross-section taken from line c-c of FIG. 10(a). As illustrated in FIG. 10, in the first resin layer 20, the edge 20e toward the terminal and the edge 20E toward the display area can be both shaped linearly, and, in planar view, the contact holes Hb, hb, Hc, and hc can coincide with the first resin layer 20.

In this case, the second routed wire Wsc is connected to the second display wire TWc through the contact hole Hc formed in the inorganic insulating film 19, the first resin layer 20, and the protective layer PF, and to the second terminal wire twc through the contact hole hc formed in the inorganic insulating film 19, the first resin layer 20, and the protective layer PF.

In the fifth embodiment, the first resin layer 20 is provided with the contact holes Hc and hc, eliminating the need for bending the edge 20c of the first resin layer 20. The fifth embodiment, a modification of the first embodiment (FIG. 6), is also applicable to the second to fourth embodiments.

Sixth Embodiment

Figure 11:
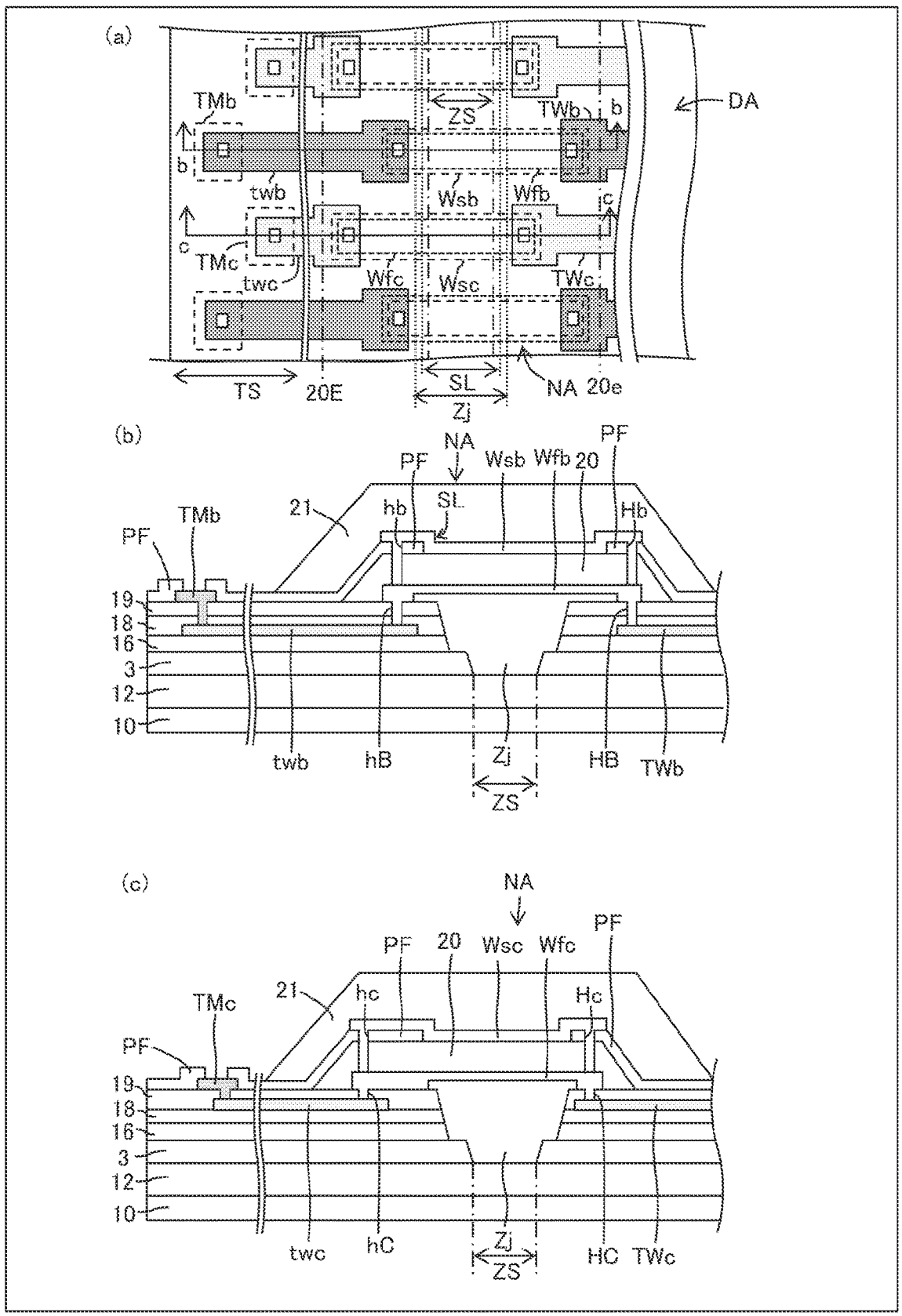
FIG. 11(a) is a plan view illustrating a configuration of a display area and a frame area according to a sixth embodiment.
FIG. 11(b) is a cross-section taken from line b-b of FIG. 11(a).
FIG. 11(c) is a cross-section taken from line c-c of FIG. 11(a).

FIG. 11(a) is a plan view illustrating a configuration of a display area and a frame area according to a sixth embodiment. FIG. 11(b) is a cross-section taken from line b-b of FIG. 11(a). FIG. 11(c) is a cross-section taken from line c-c of FIG. 11(a). As a modification of the third embodiment, the first routed wire Wfb in FIG. 11(b) may be connected to the second routed wire Wsb through the contact holes Hb and hb formed in the first resin layer 20 and the protective layer PF, and the first routed wire Wfc in FIG. 11(c) may be connected to the second routed wire Wsc through the contact holes Hc and hc formed in the first resin layer 20 and the protective layer PF.

Here, the first routed wire Wfb in FIG. 11(b) is connected to the first display wire TWb through the contact hole HB formed in the inorganic insulating films 18 and 19, and to the first terminal wire twb through the contact hole hB formed in the inorganic insulating films 18 and 19. The first routed wire Wfc in FIG. 11(c) is connected to the second display wire TWc through the contact hole HC formed in the inorganic insulating film 19, and to the second terminal wire twc through the contact hole hC formed in the inorganic insulating film 19.

SUMMARY

First Aspect

A display device is provided with a display area and a frame area on a flexible substrate. The display area includes a transistor and a light-emitting element, and the frame area surrounds the display area. The display device includes:

a folding portion provided between the display area and a terminal unit formed at an end of the frame area;

an upper inorganic insulating film, a first upper metal layer, a first resin layer, a protective layer, a second upper metal layer, a second resin layer, and a third resin layer provided in a stated order above a semiconductor layer of the transistor across the display area and the frame area;

a slit and a filler layer included in the folding portion, the slit being formed in the upper layer inorganic insulating film, and the filler layer filling the slit;

a first routed wire included in the first upper metal layer, sandwiched between the filler layer and the first resin layer, and intersecting with the slit;

a second routed wire included in the second upper metal layer, sandwiched between the first resin layer and the second resin layer, and intersecting with the slit; and an upper wire included in the second upper metal layer, and formed in the display area to come into contact with the protective layer covering the first resin layer, the upper wire electrically connecting to the first routed wire or the second routed wire.

Second Aspect

As to the display device according to, for example, the first aspect, in the folding portion, the protective layer includes a slit.

Third Aspect

As to the display device according to, for example, the first aspect, in the display area, the protective layer is formed to cover a whole face of the first resin layer except a contact hole provided to the first resin layer.

Fourth Aspect

As to the display device according to, for example, the first aspect, the protective layer is an inorganic insulating film.

Fifth Aspect

As to the display device according to, for example, the first aspect, the first upper metal layer and the second upper metal layer, each of which is a stack formed of a plurality of metal films, are made of the same material.

Sixth Aspect

As to the display device according to, for example, the first aspect, the transistor includes the semiconductor layer and a conductive electrode, and the conductive electrode is formed of the same material, and in the same layer, as the first upper metal layer, and the upper wire electrically connects to the conductive electrode through a contact hole formed in the first resin layer and the protective layer.

Seventh Aspect

As to the display device according to, for example, the first aspect, between the flexible substrate and the upper inorganic insulating film, a lower inorganic insulating film, a first lower metal layer, an intermediate inorganic insulating film, and a second lower metal layer are included in a stated order above the flexible substrate across the display area and the frame area, the frame area is provided with: a first display wire and a first terminal wire formed of the same material, and in the same layer, as the first lower metal layer, and a second display wire and a second terminal wire formed of the same material, and in the same layer, as the second lower metal layer, and one of the first routed wire and the second routed wire is electrically connected to the first display wire and the first terminal wire, and an other one of the first routed wire and the second routed wire is electrically connected to the second display wire and the second terminal wire.

Eighth Aspect

As to the display device according to, for example, the seventh aspect, one of the first routed wire and the second routed wire is electrically connected to the first display wire and the first terminal wire through two contact holes, an other one of the first routed wire and the second routed wire is electrically connected to the second display wire and the second terminal wire through other two contact holes, and a space between the two contact holes is equal to a space between the other two contact holes.

Ninth Aspect

As to the display device according to, for example, the seventh aspect, one of the first routed wire and the second routed wire is electrically connected to the first display wire through a contact hole, an other one of the first routed wire and the second routed wire is electrically connected to the second display wire through an other contact hole, and the contact hole and the other contact hole are staggered along the folding portion.

Tenth Aspect

As to the display device according to, for example, the seventh aspect, the first routed wire and the second routed wire are electrically connected to each other.

Eleventh Aspect

As to the display device according to, for example, the tenth aspect, the first routed wire and the second routed wire transmit a power source voltage.

Twelfth Aspect

As to the display device according to, for example, the tenth aspect, the first routed wire is electrically connected to the second routed wire through a contact hole penetrating the first resin layer and the protective layer.

Thirteenth Aspect

As to the display device according to, for example, the seventh aspect, the second routed wire is electrically connected to the second display wire and the second terminal wire through a contact hole penetrating the protective layer, the first resin layer, and the upper inorganic insulating film.

Fourteenth Aspect

As to the display device according to, for example, the first aspect, the terminal unit includes a terminal formed of the same material, and in the same layer, as the first upper metal layer, the protective layer is provided with an opening exposing a surface of the terminal, and the protective layer is in contact with, and covers, an edge of the terminal.

The invention claimed is:

1. A display device provided with a display area and a frame area on a flexible substrate, the display area including a transistor and a light-emitting element, and the frame area surrounding the display area, the display device comprising:
   a folding portion provided between the display area and a terminal unit formed at an end of the frame area;
   an upper inorganic insulating film, a first upper metal layer, a first resin layer, a protective layer, a second upper metal layer, a second resin layer, and a third resin layer provided in a stated order above a semiconductor layer of the transistor across the display area and the frame area;
   a slit and a filler layer included in the folding portion, the slit being formed in the upper layer inorganic insulating film, and the filler layer filling the slit;
   a first routed wire included in the first upper metal layer, sandwiched between the filler layer and the first resin layer, and intersecting with the slit;
   a second routed wire included in the second upper metal layer, sandwiched between the first resin layer and the second resin layer, and intersecting with the slit; and
   an upper wire included in the second upper metal layer, and formed in the display area to come into contact with the protective layer covering the first resin layer, the upper wire electrically connecting to the first routed wire or the second routed wire.

2. The display device according to claim 1, wherein in the folding portion, the protective layer includes a slit.

3. The display device according to claim 1, wherein in the display area, the protective layer is formed to cover a whole face of the first resin layer except a contact hole provided to the first resin layer.

4. The display device according to claim 1, wherein the protective layer is an inorganic insulating film.

5. The display device according to claim 1, wherein the first upper metal layer and the second upper metal layer, each of which is a stack formed of a plurality of metal films, are made of the same material.

6. The display device according to claim 1, wherein the transistor includes the semiconductor layer and a conductive electrode, and the conductive electrode is formed of the same material, and in the same layer, as the first upper metal layer, and
   the upper wire electrically connects to the conductive electrode through a contact hole formed in the first resin layer and the protective layer.

7. The display device according to claim 1, wherein between the flexible substrate and the upper inorganic insulating film, a lower inorganic insulating film, a first lower metal layer, an intermediate inorganic insulating film, and a second lower metal layer are included in a stated order above the flexible substrate across the display area and the frame area,
   the frame area is provided with: a first display wire and a first terminal wire formed of the same material, and in the same layer, as the first lower metal layer; and a second display wire and a second terminal wire formed of the same material, and in the same layer, as the second lower metal layer, and
   one of the first routed wire and the second routed wire is electrically connected to the first display wire and the first terminal wire, and an other one of the first routed wire and the second routed wire is electrically connected to the second display wire and the second terminal wire.

8. The display device according to claim 7, wherein one of the first routed wire and the second routed wire is electrically connected to the first display wire and the first terminal wire through two contact holes, an other one of the first routed wire and the second routed wire is electrically connected to the second display wire and the second terminal wire through other two contact holes, and a space between the two contact holes is equal to a space between the other two contact holes.

9. The display device according to claim 7, wherein one of the first routed wire and the second routed wire is electrically connected to the first display wire through a contact hole, an other one of the first routed wire and the second routed wire is electrically connected to the second display wire through an other contact hole, and the contact hole and the other contact hole are staggered along the folding portion.

10. The display device according to claim 7, wherein the first routed wire and the second routed wire are electrically connected to each other.

11. The display device according to claim 10, wherein the first routed wire and the second routed wire transmit a power source voltage.

12. The display device according to claim 10, wherein the first routed wire is electrically connected to the second routed wire through a contact hole penetrating the first resin layer and the protective layer.

13. The display device according to claim 7, wherein the second routed wire is electrically connected to the second display wire and the second terminal wire through a contact hole penetrating the protective layer, the first resin layer, and the upper inorganic insulating film.

14. The display device according to claim 1, wherein the terminal unit includes a terminal formed of the same material, and in the same layer, as the first upper metal layer,
   the protective layer is provided with an opening exposing a surface of the terminal, and the protective layer is in contact with, and covers, an edge of the terminal.

* * * * *